United States Patent
Koyama

(10) Patent No.: US 11,224,119 B2
(45) Date of Patent: Jan. 11, 2022

(54) RESIN MULTILAYER SUBSTRATE, ELECTRONIC COMPONENT, AND MOUNTING STRUCTURE THEREOF

(71) Applicant: Murata Manufacturing Co., Ltd., Nagaokakyo (JP)

(72) Inventor: Hiromasa Koyama, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 0 days.

(21) Appl. No.: 16/865,559

(22) Filed: May 4, 2020

(65) Prior Publication Data
US 2020/0267832 A1    Aug. 20, 2020

Related U.S. Application Data

(63) Continuation of application No. PCT/JP2018/040303, filed on Oct. 30, 2018.

(30) Foreign Application Priority Data

Nov. 16, 2017    (JP) .............................. JP2017-221047

(51) Int. Cl.
*H05K 1/00* (2006.01)
*H05K 1/02* (2006.01)
(Continued)

(52) U.S. Cl.
CPC ......... *H05K 1/0225* (2013.01); *H05K 1/0219* (2013.01); *H01R 12/57* (2013.01);
(Continued)

(58) Field of Classification Search
CPC .. H05K 1/00; H05K 1/02; H05K 1/03; H05K 1/09; H05K 1/11; H05K 1/14; H05K 1/16;
(Continued)

(56) References Cited

U.S. PATENT DOCUMENTS 5,337,466 A * 8/1994 Ishida ................. H01L 21/4857
156/89.12
5,374,469 A * 12/1994 Hino ...................... H05K 1/036
428/209
5,438,223 A * 8/1995 Higashi ............. H01L 23/49827
257/774

(Continued)

FOREIGN PATENT DOCUMENTS

JP    2005-136347 A    5/2005
JP    2005-317587 A    11/2005

(Continued)

OTHER PUBLICATIONS

Official Communication issued in International Patent Application No. PCT/JP2018/040303, dated Jan. 15, 2019.

*Primary Examiner* — Xiaoliang Chen
(74) *Attorney, Agent, or Firm* — Keating & Bennett, LLP

(57) ABSTRACT

A resin multilayer substrate includes a plurality of insulating resin base material layers and a plurality of conductor patterns provided on the plurality of insulating resin base material layers. The plurality of conductor patterns include a plurality of signal lines provided at positions not overlapping each other as viewed from a laminating direction of the insulating resin base material layers, and a ground conductor overlapping the plurality of the signal lines as viewed from the laminating direction. Openings are provided in the ground conductor and, as viewed from the laminating direction, an aperture ratio is higher in an inner zone that is sandwiched between two signal lines than in an outer zone of the two signal lines.

17 Claims, 11 Drawing Sheets

(51) Int. Cl.
| | |
|---|---|
| *H05K 1/03* | (2006.01) |
| *H05K 1/09* | (2006.01) |
| *H05K 1/11* | (2006.01) |
| *H05K 1/14* | (2006.01) |
| *H05K 1/16* | (2006.01) |
| *H05K 1/18* | (2006.01) |
| *H05K 3/00* | (2006.01) |
| *H05K 3/06* | (2006.01) |
| *H05K 3/10* | (2006.01) |
| *H05K 3/18* | (2006.01) |
| *H05K 3/20* | (2006.01) |
| *H05K 3/22* | (2006.01) |
| *H05K 3/26* | (2006.01) |
| *H05K 3/28* | (2006.01) |
| *H05K 3/32* | (2006.01) |
| *H05K 3/40* | (2006.01) |
| *H05K 3/42* | (2006.01) |
| *H05K 3/44* | (2006.01) |
| *H05K 3/46* | (2006.01) |
| *H01L 23/00* | (2006.01) |
| *H01L 23/02* | (2006.01) |
| *H01L 23/12* | (2006.01) |
| *H01L 23/14* | (2006.01) |
| *H01L 23/48* | (2006.01) |
| *H01L 23/50* | (2006.01) |
| *H01L 23/66* | (2006.01) |
| *H01L 23/498* | (2006.01) |
| *H01L 23/552* | (2006.01) |
| *H01R 12/57* | (2011.01) |

(52) U.S. Cl.
CPC ............... *H05K 2201/0723* (2013.01); *H05K 2201/096* (2013.01); *H05K 2201/0969* (2013.01); *H05K 2201/0979* (2013.01); *H05K 2201/09354* (2013.01); *H05K 2201/09609* (2013.01)

(58) Field of Classification Search
CPC ...... H05K 1/18; H05K 1/0219; H05K 1/0225; H05K 3/00; H05K 3/06; H05K 3/10; H05K 3/18; H05K 3/20; H05K 3/22; H05K 3/26; H05K 3/28; H05K 3/32; H05K 3/40; H05K 3/42; H05K 3/44; H05K 3/46
USPC ............... 361/784, 764, 767, 777, 782, 792; 174/252, 254–264, 266; 428/137, 198, 428/209, 212, 473.5, 544, 596
See application file for complete search history.

(56) References Cited

U.S. PATENT DOCUMENTS

| | | | | | |
|---|---|---|---|---|---|
| 5,451,721 | A * | 9/1995 | Tsukada | ............... | H05K 1/0265 174/261 |
| 5,571,608 | A * | 11/1996 | Swamy | ................ | H05K 1/0287 174/255 |
| 5,662,816 | A * | 9/1997 | Andry | ..................... | H01P 3/081 216/18 |
| 6,197,407 | B1 * | 3/2001 | Andou | ................... | H05K 3/20 174/255 |
| 6,214,445 | B1 * | 4/2001 | Kanbe | ............... | H01L 23/49822 174/250 |
| 6,323,439 | B1 * | 11/2001 | Kambe | ............... | H05K 3/0038 174/255 |
| 6,333,857 | B1 * | 12/2001 | Kanbe | ............... | H01L 23/49822 174/262 |
| 6,356,173 | B1 * | 3/2002 | Nagata | ................... | H01L 23/66 257/664 |
| 6,621,154 | B1 * | 9/2003 | Satoh | ...................... | C08L 63/00 257/40 |
| 9,232,653 | B2 * | 1/2016 | Shiozaki | ............... | H05K 1/115 |
| 2001/0005545 | A1 * | 6/2001 | Andou | ..................... | H05K 3/20 428/209 |
| 2003/0011070 | A1 * | 1/2003 | Iijima | ..................... | H05K 3/445 257/734 |
| 2003/0128532 | A1 * | 7/2003 | Somei | ..................... | H01Q 1/38 361/777 |
| 2003/0174479 | A1 * | 9/2003 | Shimura | ................ | H01L 23/66 361/764 |
| 2004/0018373 | A1 * | 1/2004 | Suzuki | ................. | H05K 3/0052 428/596 |
| 2005/0205294 | A1 * | 9/2005 | Yamashita | ............. | H05K 3/386 174/255 |
| 2006/0202322 | A1 * | 9/2006 | Kariya | ........... | H01L 23/49827 257/698 |
| 2007/0029106 | A1 * | 2/2007 | Kato | ................. | H01L 23/49838 174/255 |
| 2007/0108591 | A1 * | 5/2007 | Sunohara | ............. | H01L 21/486 257/700 |
| 2007/0222052 | A1 * | 9/2007 | Kabumoto | ........... | H05K 1/0224 257/679 |
| 2009/0183899 | A1 * | 7/2009 | Ishida | ................. | H05K 3/3447 174/252 |
| 2009/0290316 | A1 * | 11/2009 | Kariya | ................... | H01L 23/50 361/767 |
| 2010/0181558 | A1 * | 7/2010 | Yamashita | ............. | B82Y 10/00 257/40 |
| 2013/0069251 | A1 * | 3/2013 | Kunimoto | ............ | H05K 1/0298 257/784 |
| 2015/0130659 | A1 * | 5/2015 | Mori | ........................ | G01S 7/20 342/175 |
| 2015/0351251 | A1 * | 12/2015 | Hirose | ................ | H05K 3/0088 134/1 |
| 2016/0017498 | A1 * | 1/2016 | Laitar | ..................... | C23C 18/40 427/97.7 |
| 2016/0020500 | A1 * | 1/2016 | Matsuda | .................. | H05K 3/42 333/238 |
| 2016/0037622 | A1 * | 2/2016 | Shinagawa | ............ | H05K 1/028 174/254 |
| 2016/0073495 | A1 * | 3/2016 | Happoya | .............. | H05K 1/0281 174/254 |
| 2016/0174364 | A1 * | 6/2016 | Harkness, Jr | ........ | H05K 1/0242 174/257 |
| 2016/0199887 | A1 * | 7/2016 | Takezoe | ................ | B08B 3/123 134/1 |
| 2017/0012008 | A1 * | 1/2017 | Yasooka | ............... | H01L 23/552 |
| 2017/0054217 | A1 * | 2/2017 | Hashimoto | ............ | H01Q 13/10 |
| 2017/0167970 | A1 * | 6/2017 | Wang | ..................... | G01H 9/004 |
| 2017/0373020 | A1 * | 12/2017 | Sasaki | ..................... | H01L 24/83 |
| 2018/0002541 | A1 * | 1/2018 | Rietmann | ................ | C09D 5/44 |
| 2018/0184516 | A1 * | 6/2018 | Kashiwakura | .......... | H05K 1/185 |
| 2018/0209048 | A1 * | 7/2018 | Qi | .............................. | C09D 1/00 |
| 2018/0211750 | A1 * | 7/2018 | Wang | ..................... | H05K 1/165 |
| 2018/0235076 | A1 * | 8/2018 | Kashiwakura | ........ | H05K 1/0243 |
| 2019/0162778 | A1 * | 5/2019 | Kanematsu | ........ | G01R 31/2884 |
| 2019/0245275 | A1 * | 8/2019 | Hayashi | ................ | H01Q 5/42 |

FOREIGN PATENT DOCUMENTS

| | | |
|---|---|---|
| JP | 2005-353835 A | 12/2005 |
| JP | 2008-172151 A | 7/2008 |
| JP | 2009-302506 A | 12/2009 |
| JP | 2010-238692 A | 10/2010 |
| JP | 2011-066293 A | 3/2011 |

* cited by examiner

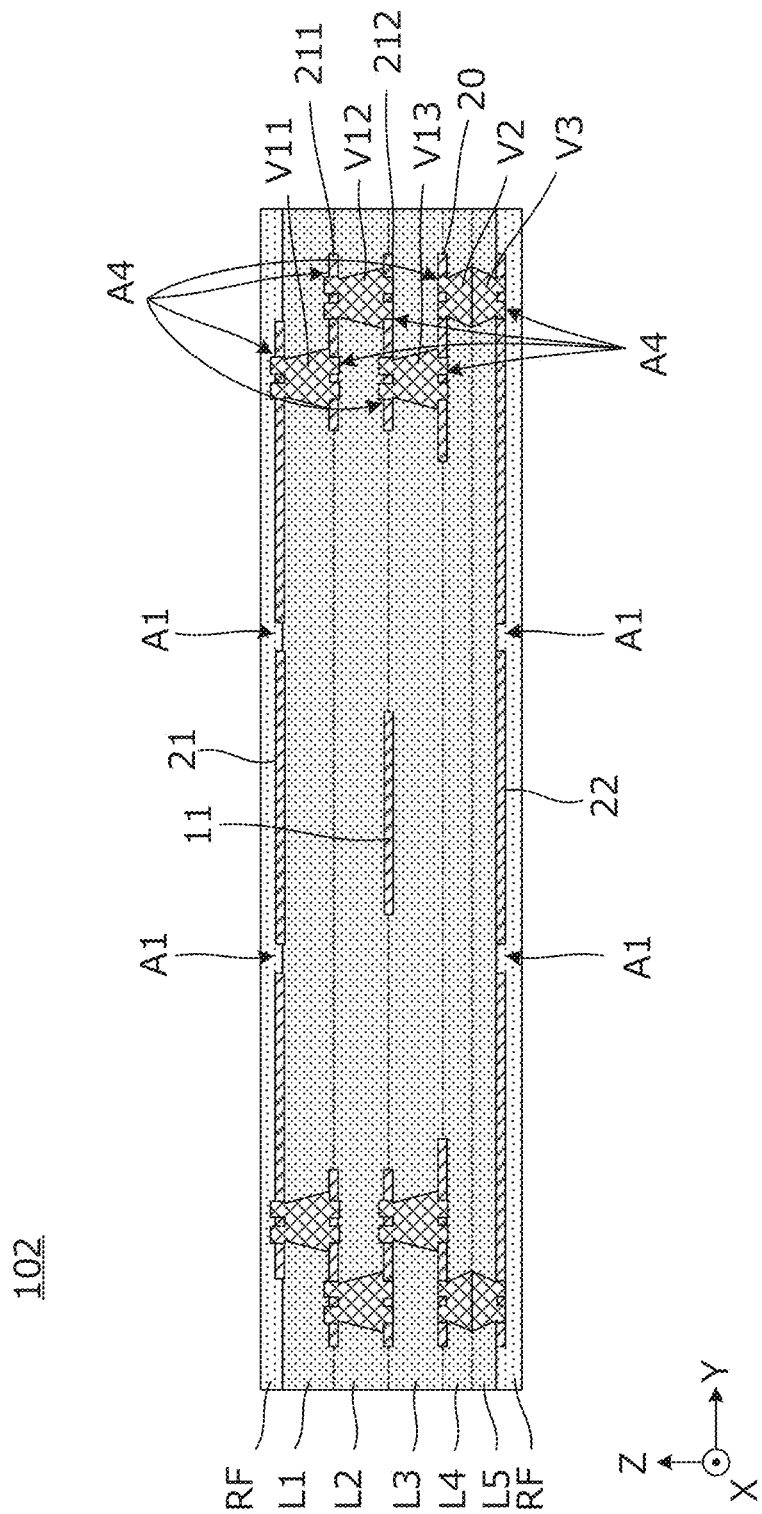

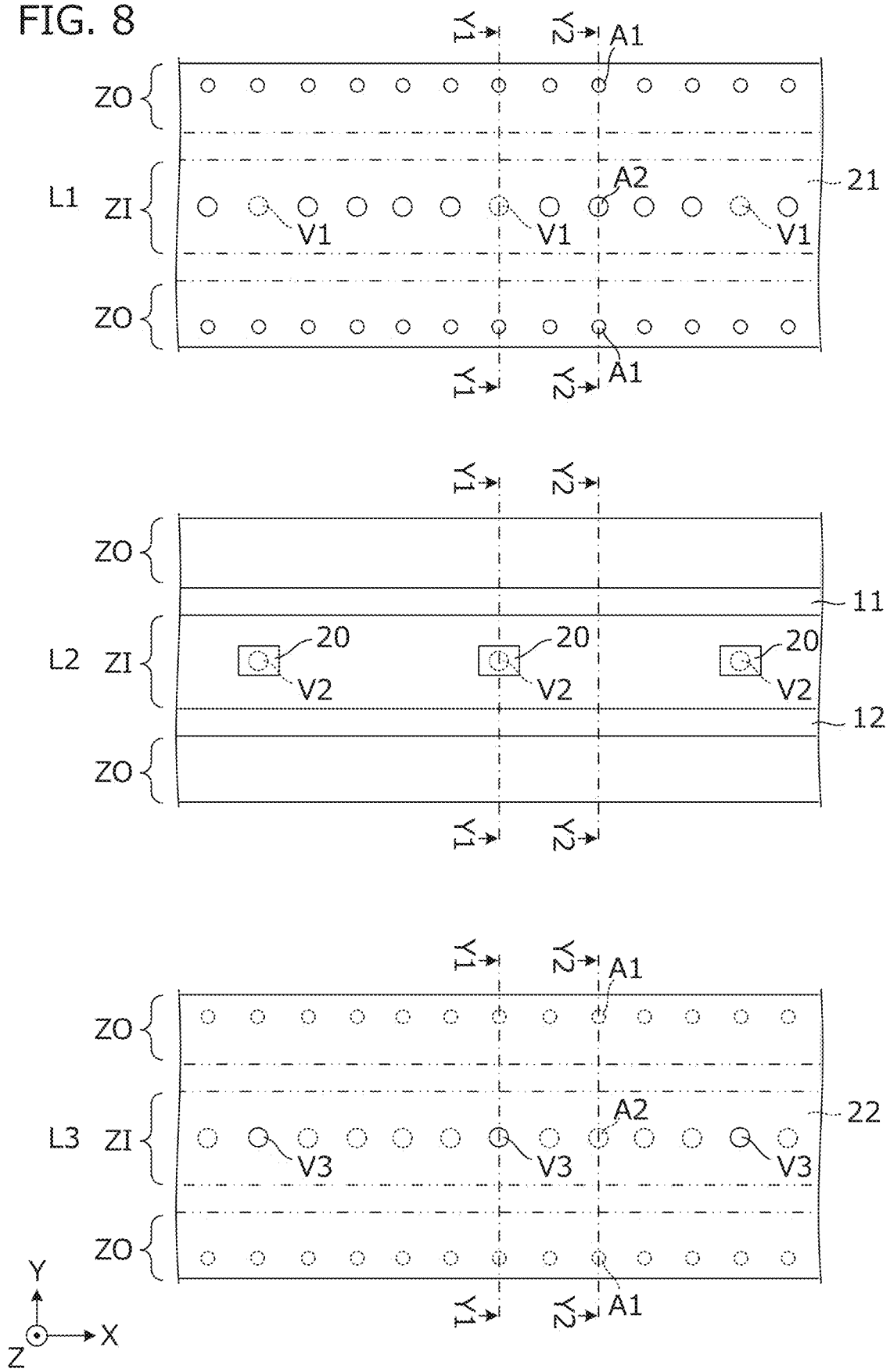

RESIN MULTILAYER SUBSTRATE, ELECTRONIC COMPONENT, AND MOUNTING STRUCTURE THEREOF

CROSS REFERENCE TO RELATED APPLICATIONS

This application claims the benefit of priority to Japanese Patent Application No. 2017-221047 filed on Nov. 16, 2017 and is a Continuation Application of PCT Application No. PCT/JP2018/040303 filed on Oct. 30, 2018. The entire contents of each application are hereby incorporated herein by reference.

BACKGROUND OF THE INVENTION

1. Field of the Invention

The present invention relates to a resin multilayer substrate including a plurality of insulating resin base material layers and a plurality of conductor patterns provided on the plurality of insulating resin base material layers, an electronic component including the resin multilayer substrate, and a mounting structure of the electronic component.

2. Description of the Related Art

Generally, when a resin base material defining a multilayer substrate receives heat at a predetermined temperature or higher, a portion of the resin base material is thermally decomposed to generate gas such as $CO_2$ and water. Additionally, oxygen resulting from a reduction reaction of oxidized conductor patterns due to the heat and carbon in the thermoplastic resin undergo an oxidation reaction to generate $CO_2$. Further, elements of the laminate absorb moisture during a manufacturing process thereof. When the multilayer substrate is heated with such a gas and water remaining in the multilayer substrate, the gas or vapor expands to cause delamination. Accordingly, in formation of the multilayer substrate, heating and pressurization are typically performed under reduced pressure and a predetermined preheating step is provided, which allows the gas to be discharged to the outside of the laminate during the heating and pressurization.

However, when the multilayer substrate has a metal pattern with a large area, the gas cannot pass through the metal pattern. Accordingly, depending on the location where the gas is generated, a gas discharge path to the outside of the multilayer substrate is longer than that in the case where there is no such a metal pattern, and thus the gas may remain in the substrate. Then, the remaining gas may expand due to heating during the manufacture of the multilayer substrate or the mounting of the multilayer substrate on another substrate, and delamination may occur after all.

For example, JP 2005-136347 A discloses a structure in which a metal pattern with a large area includes minute degassing holes penetrating it in a laminating direction. This structure allows gas generated inside during heating of a multilayer substrate to be discharged via the degassing holes through short discharge paths. That is, the amount of the gas remaining in the multilayer substrate is reduced, and delamination during the heating is reduced.

When a signal line, a ground conductor, and an insulating resin base material layer between the signal line and the ground conductor define a high-frequency transmission line in a multilayer substrate, the ground conductor corresponds to the above-described metal pattern with a large area.

However, openings as degassing holes provided in the ground conductor may cause degradation of characteristics of the transmission line. For example, since a shielding property of the ground conductor deteriorates, unnecessary radiation from the transmission line to the outside increases and/or the transmission line becomes susceptible to noise from the outside. Additionally, since continuity of capacitance generated between the signal line and the ground conductor deteriorates, the characteristic impedance of the transmission line becomes uneven. As a result, return loss and insertion loss increase. Further, when the degassing is insufficient, the outer shape or the outer surface is deformed due to delamination and mountability remarkably deteriorates.

SUMMARY OF THE INVENTION

Preferred embodiments of the present invention provide resin multilayer substrates in each of which the problem of delamination due to heating or the like is resolved while degradation of electrical characteristics of a transmission line is significantly reduced or prevented. Preferred embodiments of the present invention also provide electronic components having improved mountability on a circuit substrate or the like by significantly reducing or preventing deformation of the outer shape or the outer surface, and mounting structures of the electronic components.

A resin multilayer substrate according to a preferred embodiment of the present invention includes a plurality of insulating resin base material layers, and a plurality of conductor patterns provided on the plurality of insulating resin base material layers. The plurality of conductor patterns include a plurality of signal lines provided at positions not overlapping each other as viewed from a laminating direction of the insulating resin base material layers, and a ground conductor overlapping the plurality of signal lines as viewed from the laminating direction. The ground conductor includes a plurality of openings that provide an unevenly distributed aperture ratio. As viewed from the laminating direction, the aperture ratio due to the openings provided in an inner zone that is sandwiched between two signal lines of the plurality of signal lines is higher than the aperture ratio due to the openings provided in an outer zone that is not sandwiched between the two signal lines.

The above features enable the gas generated in the inner zone to efficiently escape from the openings in the inner zone before moving a relatively long distance to the outside. Therefore, degassing is effectively performed from the entire resin multilayer substrate during heating.

The ground conductor may include a plurality of ground conductors between which the signal lines are sandwiched in the laminating direction, and the resin multilayer substrate may include an interlayer connecting conductor that electrically connects the ground conductors provided on different layers to each other. According to this structure, since a side of the transmission line is electrically shielded by the interlayer connecting conductor, unnecessary radiation to the side is significantly reduced or prevented and/or the transmission line is hardly affected by noise from the outside. Further, the potentials of the plurality of ground conductors between which the signal lines are sandwiched are stabilized, and thus the electrical characteristics of the transmission line are stabilized.

The interlayer connecting conductor may be provided in the outer zone. This structure significantly reduces or prevents unnecessary radiation from the plurality of transmission lines to the outside and/or noise received from the outside.

The interlayer connecting conductor may be provided in the inner zone. This causes the interlayer connecting conductor to shield the two signal lines from each other.

The interlayer connecting conductor may include a resin component. This facilitates formation of the interlayer connecting conductor, and provides high bondability between the insulating resin base material layer and the interlayer connecting conductor.

The interlayer connecting conductor may be in contact with the insulating resin base material layers via the openings. According to this structure, the gas escapes also from an end of the interlayer connecting conductor in the laminating direction, and thus the degassing is more efficient.

Both sides of the interlayer connecting conductor in the laminating direction may be in contact with the insulating resin base material layers via the openings. According to this structure, the gas generated from the interlayer connecting conductor escapes more efficiently.

The interlayer connecting conductor may be provided over the plurality of insulating resin base material layers and may have a portion provided in a zigzag shape in the laminating direction. According to this structure, since the opening amount per unit thickness in the laminating direction increases, the gas generated from the insulating resin base material layers and the interlayer connecting conductor escapes efficiently.

The aperture ratio due to the openings may be higher, in a direction perpendicular or substantially perpendicular to the laminating direction, in a zone adjacent to or in a vicinity of the interlayer connecting conductor than in a zone separated from the interlayer connecting conductor. This structure significantly reduces or prevents the total area of the entire openings, and allows the gas generated from the interlayer connecting conductor to escape efficiently.

The openings may be provided at positions not overlapping the signal lines as viewed from the laminating direction. This structure is able to significantly reduce or prevent a change in capacitance generated between the signal lines and portions of the ground conductor adjacent to or in a vicinity of the signal lines.

An electronic component according to a preferred embodiment of the present invention includes a first connecting portion and a second connecting portion to be electrically connected to an external circuit, and a transmission line portion linking the first connecting portion and the second connecting portion. The first connecting portion, the second connecting portion, and the transmission line portion are defined by a resin multilayer substrate. The resin multilayer substrate includes a plurality of insulating resin base material layers, and a plurality of conductor patterns provided on the plurality of insulating resin base material layers. The plurality of conductor patterns include a plurality of signal lines provided at positions not overlapping each other as viewed from a laminating direction of the insulating resin base material layers, and a ground conductor overlapping the plurality of signal lines as viewed from the laminating direction. The ground conductor includes a plurality of openings that provide an unevenly distributed aperture ratio. As viewed from the laminating direction, the aperture ratio due to the openings provided in an inner zone that is sandwiched between two signal lines out of the plurality of signal lines is higher than the aperture ratio due to the openings provided in an outer zone that is not sandwiched between the two signal lines.

The above features significantly reduce or prevent deformation of the outer shape or the outer surface due to delamination, and improve mountability of surface-mounting on a circuit substrate, for example.

A mounting structure according to a preferred embodiment of an electronic component of the present invention includes a circuit substrate and an electronic component that is surface-mounted on the circuit substrate.

The electronic component includes a first connecting portion and a second connecting portion to be electrically connected to an external circuit, and a transmission line portion linking the first connecting portion and the second connecting portion. The first connecting portion, the second connecting portion, and the transmission line portion are defined by a resin multilayer substrate. The resin multilayer substrate includes a plurality of insulating resin base material layers, and a plurality of conductor patterns provided on the plurality of insulating resin base material layers. The plurality of conductor patterns include a plurality of signal lines provided at positions not overlapping each other as viewed from a laminating direction of the insulating resin base material layers, and a ground conductor overlapping the plurality of signal lines as viewed from the laminating direction. The ground conductor includes a plurality of openings that provide an unevenly distributed aperture ratio. As viewed from the laminating direction, the aperture ratio due to the openings provided in an inner zone that is sandwiched between two signal lines out of the plurality of signal lines is higher than the aperture ratio due to the openings provided in an outer zone that is not sandwiched between the two signal lines.

The above features provide the mounting structure in which the electronic component having high flatness is surface-mounted on a circuit substrate.

According to the preferred embodiments of the present invention, it is possible to provide a resin multilayer substrate in which the problem of delamination due to heating or the like is resolved while degradation of the electrical characteristics of the transmission line is significantly reduced or prevented.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 4 is a longitudinal sectional view of a resin multilayer substrate 102 according to a second preferred embodiment of the present invention.

FIG. 8 shows plan views of a plurality of insulating resin base material layers before being laminated that define a main portion of a resin multilayer substrate 105 according to a fifth preferred embodiment of the present invention.

DETAILED DESCRIPTION OF THE PREFERRED EMBODIMENTS

Figure 1A:
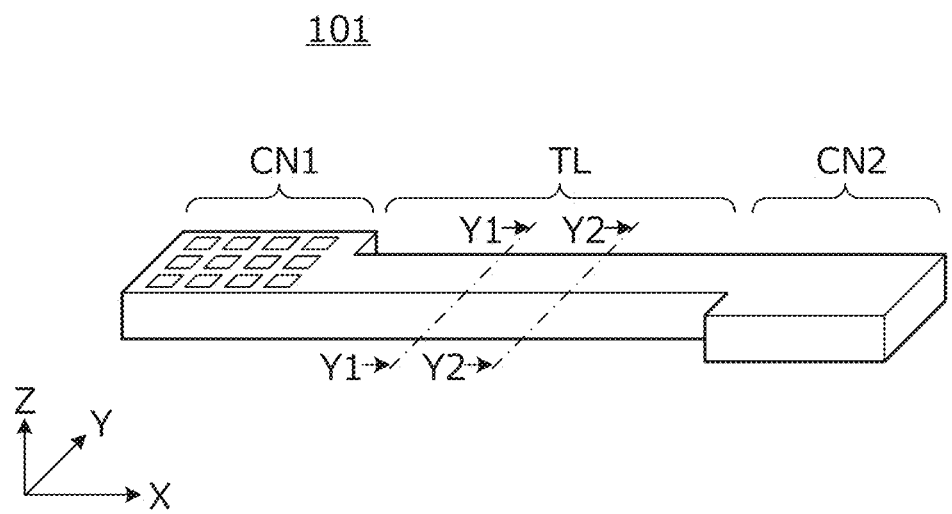
FIG. 1A is an external perspective view of a resin multilayer substrate 101 according to a first preferred embodiment of the present invention.

Hereinafter, preferred embodiments of the present invention will be described in detail with reference to the drawings and some specific examples. In the drawings, the same or similar portions and elements are denoted by the same reference signs. The preferred embodiments are described separately for convenience in consideration of ease of explanation or understanding of main points. However, configurations shown in different preferred embodiments are able to be partially replaced or combined. In a second and subsequent preferred embodiments, description of matters common to a first preferred embodiment will be omitted, and only different points will be described. In particular, a similar advantageous effect by a similar configuration will not be sequentially described for each preferred embodiment.

First Preferred Embodiment

Figure 1B:
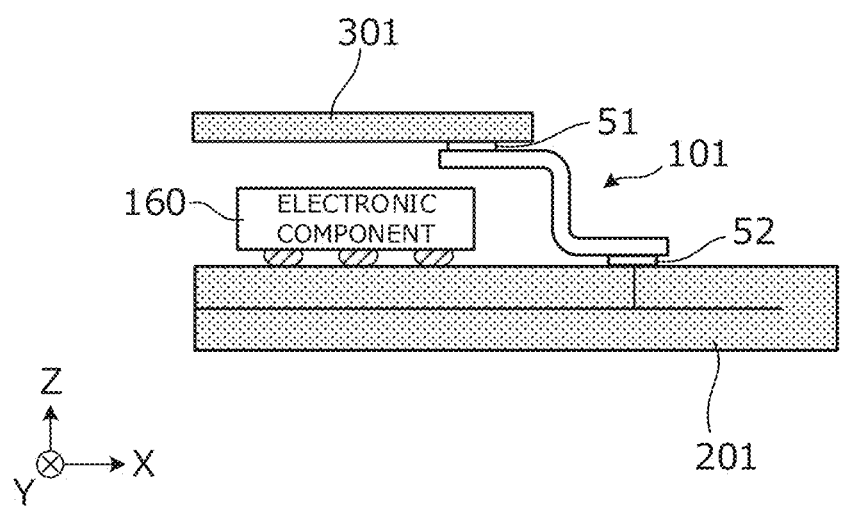
FIG. 1B is a cross-sectional view showing a mounting structure of the resin multilayer substrate 101.

FIG. 1A is an external perspective view of a resin multilayer substrate 101 according to a first preferred embodiment of the present invention. FIG. 1B is a cross-sectional view showing a mounting structure of the resin multilayer substrate 101. In an example shown in FIG. 1B, the resin multilayer substrate 101 is an electronic component used as a cable that electrically connects another circuit substrate 201 and a component 301. This resin multilayer substrate 101 is also an example of the "electronic component". The resin multilayer substrate 101 includes a first connecting portion CN1, a second connecting portion CN2, and a transmission line portion TL. Connection electrodes are exposed on an upper surface of the first connecting portion CN1 shown in FIG. 1A and on a lower surface of the second connecting portion CN2 shown in FIG. 1A, respectively. The transmission line portion TL has a strip-line high-frequency transmission line linking the first connecting portion CN1 and the second connecting portion CN2. This transmission line portion TL may be bent. Further, the first connecting portion CN1 and/or the second connecting portion CN2 may have a connector.

In the example shown in FIG. 1B, the resin multilayer substrate 101 is electrically connected to the component 301 via a connector 51, and electrically connected to a circuit provided on the circuit substrate 201 via a connector 52. In this example, an electronic component 160 is also mounted on the circuit substrate 201. The resin multilayer substrate 101 is structured to avoid the electronic component 160 and not to be unnecessarily coupled to this electronic component.

Figure 2:
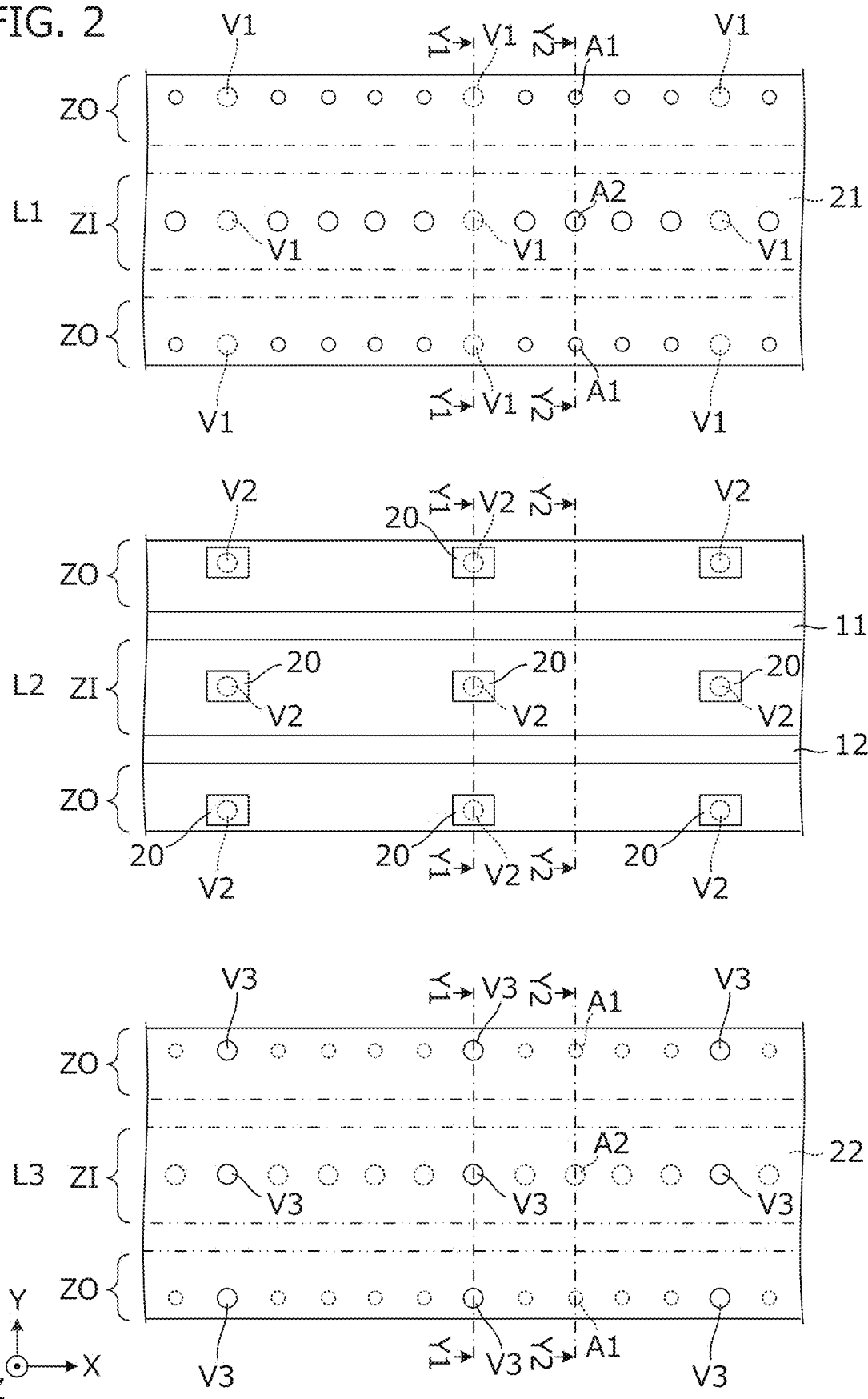
FIG. 2 shows plan views of a plurality of insulating resin base material layers before being laminated that define a main portion of the resin multilayer substrate 101.

FIG. 2 shows plan views of a plurality of insulating resin base material layers before being laminated that define a main portion of the resin multilayer substrate 101. In FIG. 2, positions corresponding to the line Y1-Y1 and the line Y2-Y2 are indicated by dash-dot lines. Further, positions to which signal lines 11, 12 face are indicated by dash-dot-dot lines.

Figure 3A:
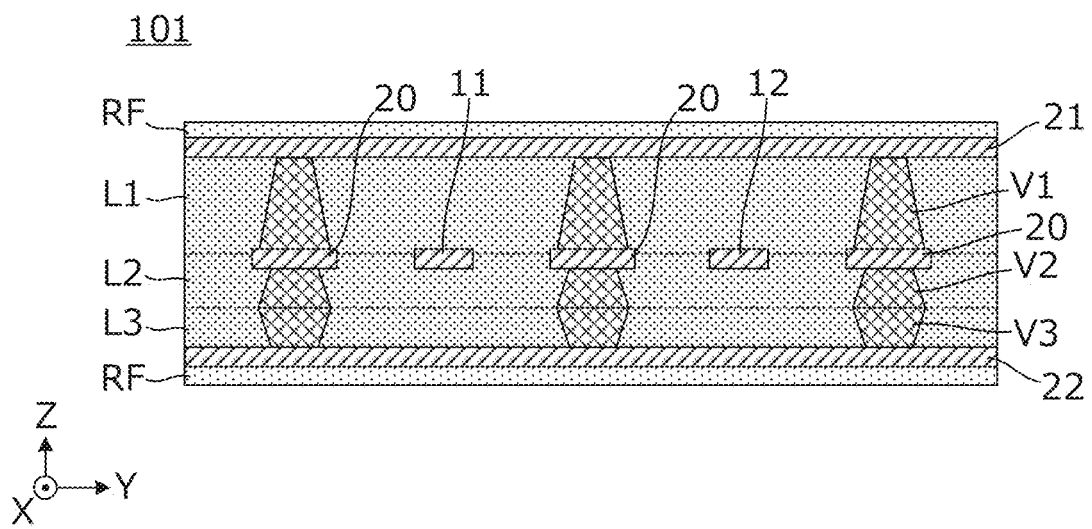
FIG. 3A is a longitudinal sectional view along the line Y1-Y1 in FIGS. 1A and 2.
Figure 3B:
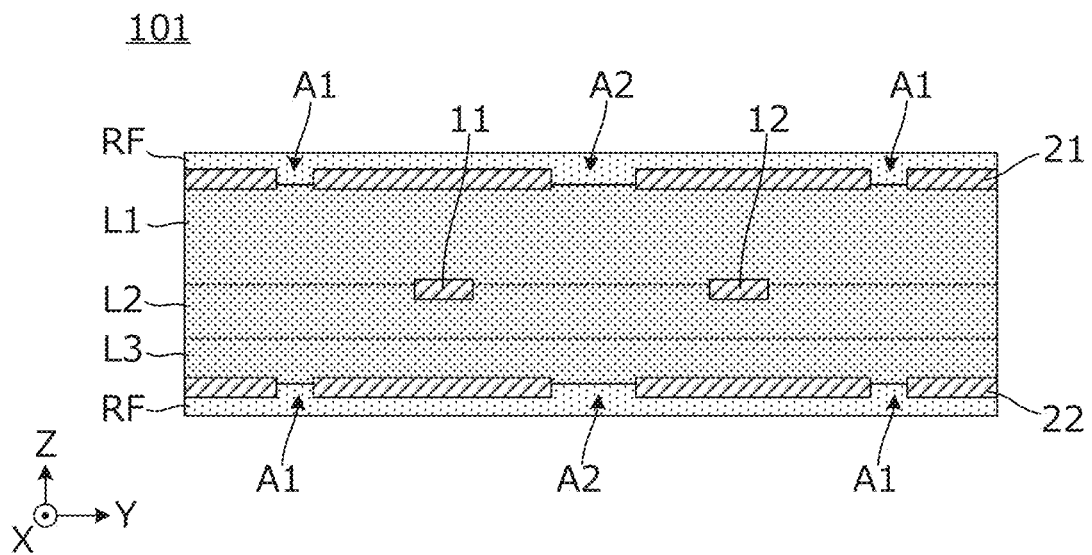
FIG. 3B is a longitudinal sectional view along the line Y2-Y2 in FIGS. 1A and 2.

FIG. 3A is a longitudinal sectional view along the line Y1-Y1 in FIGS. 1A and 2, and FIG. 3B is a longitudinal sectional view along the line Y2-Y2 in FIGS. 1A and 2. FIG. 2 shows an individual-piece state for convenience of explanation, but a normal manufacturing process is performed in an aggregate-substrate state.

The resin multilayer substrate 101 includes three insulating resin base material layers L1, L2, L3, resist films RF covering both surfaces of a laminate of the insulating resin base material layers L1, L2, L3, and a plurality of conductor patterns provided on the insulating resin base material layers L1, L2, L3. The conductor patterns include the signal lines 11, 12 and ground conductors 21, 22 overlapping the signal lines 11, 12 as viewed from the laminating direction of the insulating resin base material layers L1, L2, L3 (direction parallel or substantially parallel to the Z-axis). The signal lines 11, 12, the ground conductors 21, 22, and the insulating resin base material layers L1, L2, L3 between the signal lines 11, 12 and the ground conductors 21, 22 define two strip-line transmission lines or one strip-line differential transmission line.

The insulating resin base material layers L1, L2, L3 are preferably thermoplastic resin base material mainly including liquid crystal polymer (LCP) or polyether ether ketone (PEEK), for example.

An interlayer connecting conductor V1 connecting the ground conductor 21 and an interlayer connection conductor pattern 20 is provided in the insulating resin base material layer L1. An interlayer connecting conductor V2 electrically connected to the interlayer connection conductor pattern 20 is provided in the insulating resin base material layer L2. An interlayer connecting conductor V3 connecting the ground conductor 22 and the interlayer connecting conductor V2 is provided in the insulating resin base material layer L3. The interlayer connecting conductors V1, V2, V3 are, for example, via conductors provided by disposing, in openings that define the interlayer connecting conductor provided in the insulating resin base material layers, conductive paste preferably including metal powder of, for example, at least one metal out of Cu and Sn or an alloy thereof and a resin component, and then by solidifying the paste through a heat press treatment in a lamination process.

The ground conductors 21, 22, the interlayer connection conductor pattern 20, the signal lines 11, 12, and the like are preferably provided by patterning Cu foil by photolithography, for example, the Cu foil being attached to the insulating resin base material layers.

According to the above structure, since a side of the transmission line is electrically shielded by the interlayer connecting conductors V1, V2, V3, unnecessary radiation to the side is significantly reduced or prevented and/or the transmission line is hardly affected by noise from the outside. Further, the potentials of the plurality of ground conductors between which the signal lines are sandwiched are stabilized, and thus the electrical characteristics of the transmission line are stabilized.

A plurality of openings A1, A2 are provided in the ground conductors 21, 22. The openings A1, A2 provide the aperture ratio, as viewed from the laminating direction (direction parallel or substantially parallel to the Z-axis) (in plan view), in an inner zone ZI that is sandwiched between the two signal lines 11, 12 higher than the aperture ratio in an outer zone ZO that is outside the zone between the two signal lines 11, 12.

In the example shown in FIG. 2, in plan view, the small-diameter openings A1 are provided in the outer zone ZO of the signal lines 11, 12 and the large-diameter openings A2 are provided in the inner zone ZI sandwiched between the signal lines 11, 12.

That is, according to a distribution of the plurality of openings A1, A2 in the ground conductors 21, 22, the aperture ratio is higher in the inner zone ZI than in the outer zone ZO of the signal lines 11, 12 in plan view.

The above features enable the gas generated in the inner zone ZI to promptly escape from the openings A2 present in the inner zone ZI before moving to the outside for a relatively long distance. Therefore, degassing is effectively performed from the entire resin multilayer substrate during heating. Accordingly, delamination is less likely to occur during heating in manufacturing and/or use phases of the resin multilayer substrate, and deterioration of the electrical characteristics, for example, a characteristic impedance change of the transmission line due to delamination, is able to be significantly reduced or prevented. Furthermore, since unevenness and curvature of the surface of the resin multilayer substrate due to delamination are eliminated or reduced, the mountability of the resin multilayer substrate is improved. In particular, when there is a bent portion, delamination is likely to occur due to stress applied to the bent portion. Therefore, the above features are also effective in the resin multilayer substrate having such a bent portion.

In FIG. 2, the openings A1 are aligned at a constant or substantially constant pitch in a direction parallel or substantially parallel to the X-axis, and are provided at an equal or a substantially equal distance in a direction parallel or substantially parallel to the Y-axis. The openings A2 are also aligned at a constant or substantially constant pitch in the direction parallel or substantially parallel to the X-axis.

Thus, it is preferable that the openings A1, A2 are periodically and regularly aligned, for example. As a result, the distribution of the openings is less biased, and the degassing effect is likely to be uniform in the plane direction. That is, since no gas remains locally, an effect of significantly reducing or preventing delamination is improved. The alignment pitch of the openings A1 in the X-axis direction may be different from the alignment pitch of the openings A2 in the X-axis direction. Further, the openings A1 and the openings A2 do not have to be aligned in the direction parallel or substantially parallel to the Y-axis. The openings do not have to be aligned in a straight line in the direction parallel or substantially parallel to the X-axis or in the direction parallel or substantially parallel to the Y-axis, and may be provided in a zigzag shape.

The openings A1, A2 are provided at positions not overlapping the signal lines 11, 12 in plan view. Therefore, it is possible to significantly reduce or prevent a change in capacitance generated between the signal lines 11, 12 and portions of the ground conductors 21, 22 adjacent to or in a vicinity of the signal lines 11, 12, and maintain continuity of the characteristic impedance of the transmission line. Moreover, since the openings do not overlap the signal lines in plan view, it is possible to avoid the problems due to the existence of the openings that unnecessary radiation from the transmission line to the outside increases or that the transmission line is susceptible to noise from the outside. Further, the continuity of the capacitance generated between the signal lines and the ground conductors does not deteriorate, and the evenness of the characteristic impedance of the transmission line is maintained. In this example, all of the openings A1, A2 are provided only at positions not overlapping the signal lines 11, 12 as viewed from the laminating direction. However, a portion of the openings A1, A2 may overlap the signal lines 11, 12. This is because, when an overlapping amount is small, the above-mentioned capacitance change makes no difference.

The signal lines 11, 12 are sandwiched between the ground conductors 21, 22 in the laminating direction. The interlayer connecting conductors V1, V2, V3 electrically connect the ground conductors 21, 22 to each other. According to this structure, since a side of the signal lines 11, 12 is electrically shielded by the interlayer connecting conductors V1, V2, V3, unnecessary radiation to the side is significantly reduced or prevented and/or the transmission line is hardly susceptible to noise from the outside. Further, the interlayer connecting conductors V1, V2, V3 are also provided between the signal lines 11, 12 and thus isolate the signal lines 11, 12 from each other. The potentials of the ground conductors 21, 22 are stabilized, and the electrical characteristics of the transmission line are stabilized.

The diameters of the openings A1 are preferably about 30 μm to about 70 μm, for example, and the diameters of the openings A2 are preferably about 50 μm to about 90 μm, for example. The line widths of the signal lines 11, 12 are preferably about 100 μm to about 140 μm, for example. That is, the diameters of the openings A1, A2 are smaller than the line widths of the signal lines 11, 12. This structure results in small influence of the openings A1, A2 on the electrical characteristics of the transmission line.

The diameters of the interlayer connecting conductors V1, V2, V3 are preferably about 80 μm to about 100 μm, for example. The diameters of the openings A1, A2 are smaller than the diameters of the interlayer connecting conductors V1, V2, V3. The openings have a degassing effect with a diameter of a certain length or more, and the interlayer connecting conductors have electrical characteristics (decrease in electrical resistance) that are improved as the width thereof increases. Therefore, the above structure is able to improve the electrical characteristics of the interlayer connecting conductors while maintaining the degassing effect.

As described above, the interlayer connecting conductors are preferably the conductive paste including a resin component before heating and thus are simultaneously provided in a step of laminating and hot-pressing the plurality of insulating resin base material layers L1, L2, L3. That is, the interlayer connecting conductors are easily provided. In addition, since the conductive paste has a resin component, high bondability is able to be provided between the insulating resin base material layers and the interlayer connecting conductors. The resin component of the conductive paste is preferably the same or similar type as the resin component of the insulating resin base material layers, for example.

The resist film RF is provided by printing after formation of the laminate by laminating and hot-pressing the insulating resin base material layers L1, L2, L3. Instead of the resist film RF, a coverlay film may be laminated and hot-pressed together with the insulating resin base material layers L1, L2, L3. The resist film RF is preferably epoxy resin, for example. The epoxy resin has higher gas permeability than the LCP or the PEEK that is the material of the insulating resin base material layers. Therefore, the existence of the resist film RF hardly impairs the gas permeability.

In the example shown in FIGS. 2, 3A, and 3B, the interlayer connecting conductors V1, V2, V3 are provided in the inner zone ZI between the signal lines 11, 12, and thus the example is preferable in that the interlayer connecting conductors V1, V2, V3 isolate the signal lines 11, 12 from each other. However, in respect of releasing the gas generated from the interlayer connecting conductors V1, V2, V3 to the outside, it is preferable that there are no interlayer connecting conductors V1, V2, V3 in the inner zone ZI between the signal lines 11, 12.

Second Preferred Embodiment

In a second preferred embodiment of the present invention, an example is shown in which an interlayer connecting conductor is in contact with an insulating resin base material layer via an opening provided in a ground conductor.

FIG. 4 is a longitudinal sectional view of a resin multilayer substrate 102 according to the second preferred embodiment. The resin multilayer substrate 102 includes insulating resin base material layers L1, L2, L3, L4, L5, resist films RF covering both surfaces of a laminate of the insulating resin base material layers L1, L2, L3, L4, L5, and a plurality of conductor patterns provided on the insulating resin base material layers L1, L2, L3, L4, L5. The conductor patterns include a signal line 11 and ground conductors 21, 22 overlapping the signal line 11 as viewed from the laminating direction of the insulating resin base material layers (direction parallel or substantially parallel to the Z-axis). The signal line 11, the ground conductors 21, 22, and the insulating resin base material layers L1, L2, L3, L4, L5 between the signal line 11 and the ground conductors 21, 22 define a strip-line transmission line.

An interlayer connecting conductor V11 connecting the ground conductor 21 and an interlayer connection conductor pattern 211 is provided in the insulating resin base material layer L1. An interlayer connecting conductor V12 connecting the interlayer connection conductor pattern 211 and an interlayer connection conductor pattern 212 is provided in the insulating resin base material layer L2. An interlayer connecting conductor V13 connecting the interlayer connection conductor pattern 212 and an interlayer connection conductor pattern 20 is provided in the insulating resin base material layer L3. An interlayer connecting conductor V2 electrically connected to the interlayer connection conductor pattern 20 is provided in the insulating resin base material layer L4. An interlayer connecting conductor V3 connecting the ground conductor 22 and the interlayer connecting conductor V2 is provided in the insulating resin base material layer L5.

Unlike the resin multilayer substrate shown in the first preferred embodiment, openings A4 that allow the interlayer connecting conductors to contact with the insulating resin base material layers are provided in the ground conductors 21, 22 and the interlayer connection conductor patterns 211, 212, 20.

Figure 5:
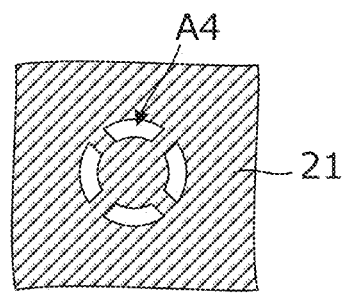
FIG. 5 is a partial plan view showing a shape of an opening A4 provided in a ground conductor 21.

FIG. 5 is a partial plan view showing the shape of the opening A4 provided in the ground conductor 21. The opening A4 is a group of a plurality of arc-shaped openings and has a ring shape as a whole. The upper end of the interlayer connecting conductor V11 is exposed from the ring-shaped opening A4. Thus, the interlayer connecting conductor exposed from the opening A4 contacts with the resist film RF. The lower end of the interlayer connecting conductor V11 is exposed from another opening A4 to contact with the insulating resin base material layer L2. Similarly, the upper end of the interlayer connecting conductor V12 is exposed from another opening A4 to contact with the insulating resin base material layer L1. The lower end of the interlayer connecting conductor V12 is exposed from another opening A4 to contact with the insulating resin base material layer L3. The upper end of the interlayer connecting conductor V13 is exposed from another opening A4 to contact with the insulating resin base material layer L2. The lower end of the interlayer connecting conductor V13 is exposed from another opening A4 to contact with the insulating resin base material layer L4. The upper end of the interlayer connecting conductor V2 is exposed from another opening A4 to contact with the insulating resin base material layer L3. Further, the lower end of the interlayer connecting conductor V3 is exposed from another opening A4 to contact with the resist film RF.

According to such a structure, the gas also escapes from the ends of the interlayer connecting conductors V11, V12, V13, V2, V3 in the laminating direction, and thus degassing is more efficient.

As shown in FIG. 4, it is preferable to provide the opening A4 at each contact position between the interlayer connecting conductor and the conductor pattern for all the interlayer connecting conductors. However, even when the openings A4 are provided at a portion of the positions, the degassing effect is improved.

The interlayer connecting conductors V11, V12, V13 are provided over the insulating resin base material layers L1, L2, L3, and are provided in a zigzag shape in the laminating direction. According to such a structure, since an opening amount (total opening area) per unit thickness in the laminating direction increases, the gas generated from the insulating resin base material layers and the interlayer connecting conductors escapes efficiently.

Third Preferred Embodiment

In a third preferred embodiment of the present invention, an example of a resin multilayer substrate including openings of which distribution is different from that in the first and second preferred embodiments is shown.

Figure 6:
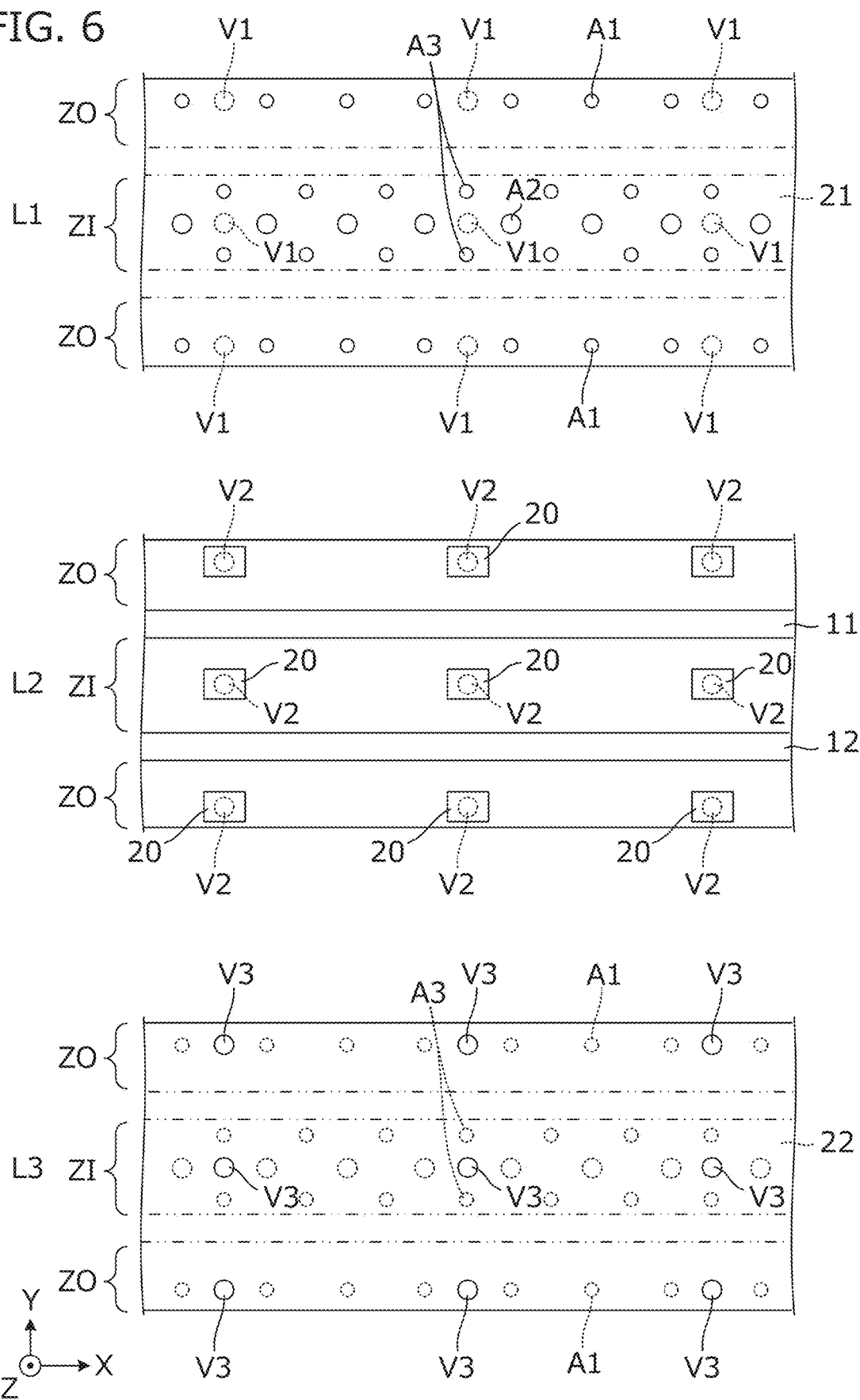
FIG. 6 shows plan views of a plurality of insulating resin base material layers before being laminated that define a main portion of a resin multilayer substrate according to a third preferred embodiment of the present invention.

FIG. 6 shows plan views of a plurality of insulating resin base material layers before being laminated that define a main portion of the resin multilayer substrate.

A plurality of openings A1, A2, A3 are provided in ground conductors 21, 22. Regarding the openings A1, A2, A3, in plan view, the small-diameter openings A1 are provided in the outer zone ZO of signal lines 11, 12 and the large-diameter openings A2 and the small-diameter openings A3 are provided in the inner zone ZI that is sandwiched between the signal lines 11, 12. That is, according to a distribution of the plurality of openings A1, A2 in the ground conductors 21, 22, the aperture ratio is higher in the inner zone ZI of the signal lines 11, 12 than in the outer zone ZO of the signal lines 11, 12 in plan view.

Further, the openings A3 are provided between the interlayer connecting conductors V1, V2, V3 and the signal line 11, and between the interlayer connecting conductors V1, V2, V3 and the signal line 12. In this example, the openings A2, A3 surround four sides of the interlayer connecting conductors V1, V2, V3 in plan view.

According to the third preferred embodiment, the aperture ratio is higher, in a direction perpendicular or substantially perpendicular to the laminating direction, in a zone adjacent to or in a vicinity of the interlayer connecting conductors V1, V2, V3 than in a zone separated from the interlayer connecting conductors V1, V2, V3. This structure allows the gas generated from the interlayer connecting conductors V1, V2, V3 to escape from the openings A2, A3 efficiently while significantly reducing the total area of the openings.

Fourth Preferred Embodiment

In a fourth preferred embodiment of the present invention, a resin multilayer substrate 104 is shown in which signal lines are provided at height positions different from each other.

Figure 7A:
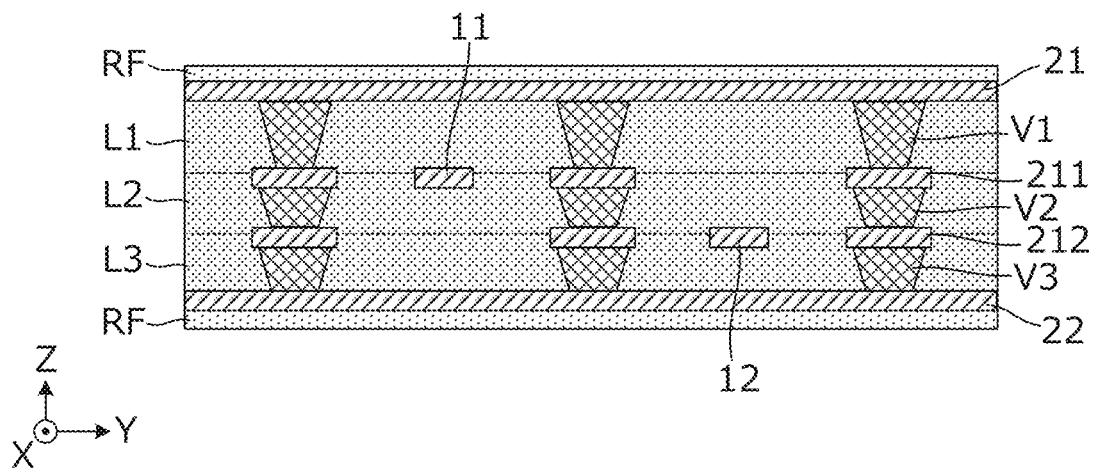
FIG. 7A is a longitudinal sectional view of a resin multilayer substrate 104 according to a fourth preferred embodiment.
Figure 7B:
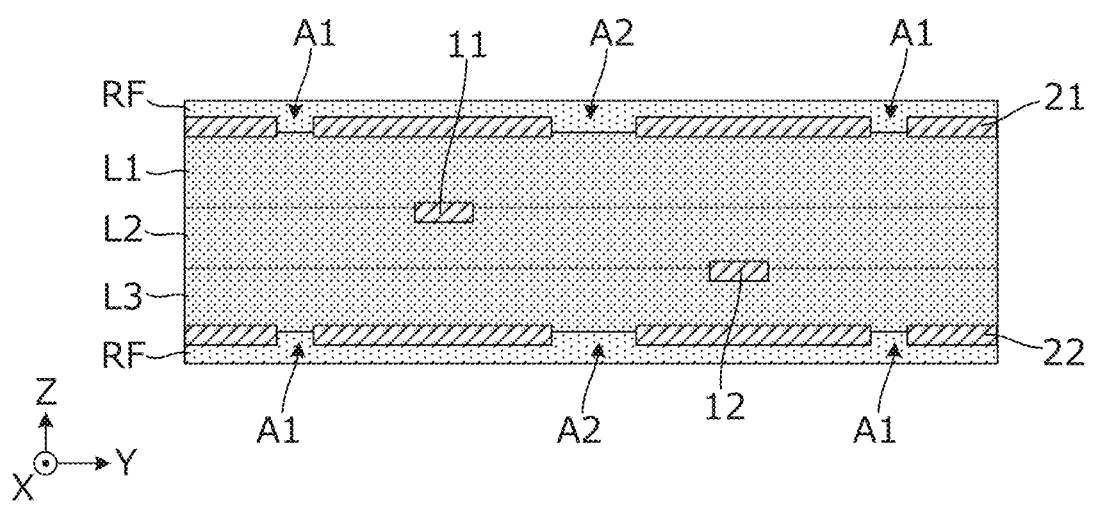
FIG. 7B is a longitudinal sectional view of the resin multilayer substrate 104 according to the fourth preferred embodiment of the present invention.

FIGS. 7A and 7B are longitudinal sectional views of the resin multilayer substrate 104 according to the fourth preferred embodiment. FIG. 7A is a longitudinal sectional view along a plane passing through the interlayer connecting conductors V1, V2, V3. FIG. 7B is a longitudinal sectional view along a plane passing through small-diameter openings A1 and large-diameter openings A2.

The resin multilayer substrate 104 includes insulating resin base material layers L1, L2, L3, resist films RF covering both surfaces of a laminate of the insulating resin base material layers, and a plurality of conductor patterns provided on the insulating resin base material layers. The conductor patterns include signal lines 11, 12 and ground conductors 21, 22 overlapping the signal lines 11, 12 as viewed from the laminating direction of the insulating resin base material layers (direction parallel or substantially parallel to the Z-axis). The signal lines 11, 12, the ground conductors 21, 22, and the insulating resin base material layers L1, L2, L3 between the signal lines 11, and the ground conductors 21, 22 define two strip-line transmission lines.

The openings A1, A2 are provided in the ground conductors 21, 22 as in the first preferred embodiment, and the distribution of the openings is the same or substantially the same as that shown in the first preferred embodiment.

As shown in the fourth preferred embodiment, the signal lines may be provided at different height positions in the laminating direction.

Fifth Preferred Embodiment

In a fifth preferred embodiment of the present invention, a resin multilayer substrate 105 including an interlayer connecting conductor defined by a plating film is shown.

FIG. 8 shows plan views of a plurality of insulating resin base material layers before being laminated that define a main portion of the resin multilayer substrate 105. Positions to which signal lines 11, 12 face are indicated by dash-dot-dot lines.

Figure 9A:
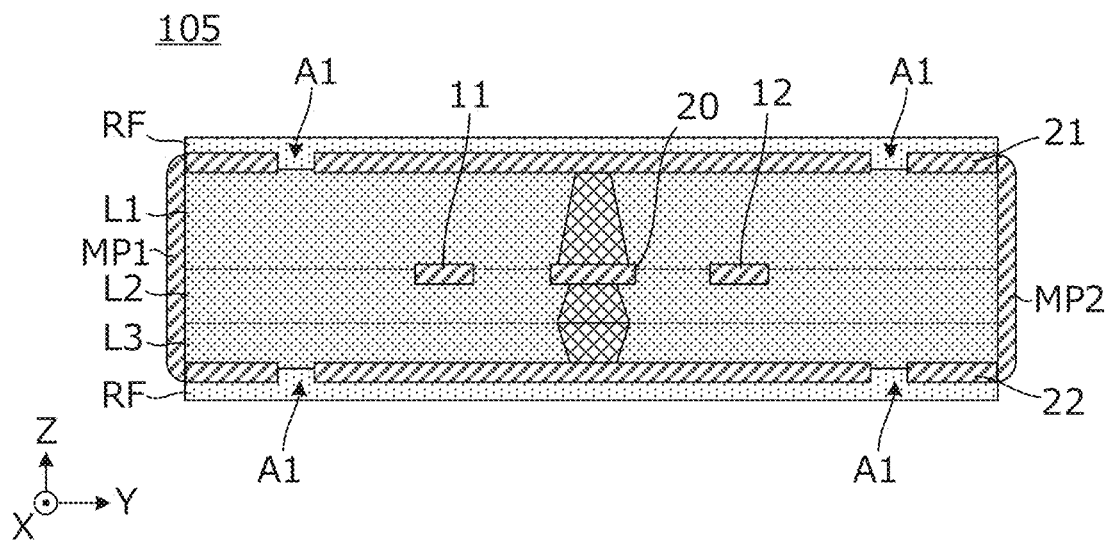
FIG. 9A is a longitudinal sectional view along the line Y1-Y1 in FIG. 8.
Figure 9B:
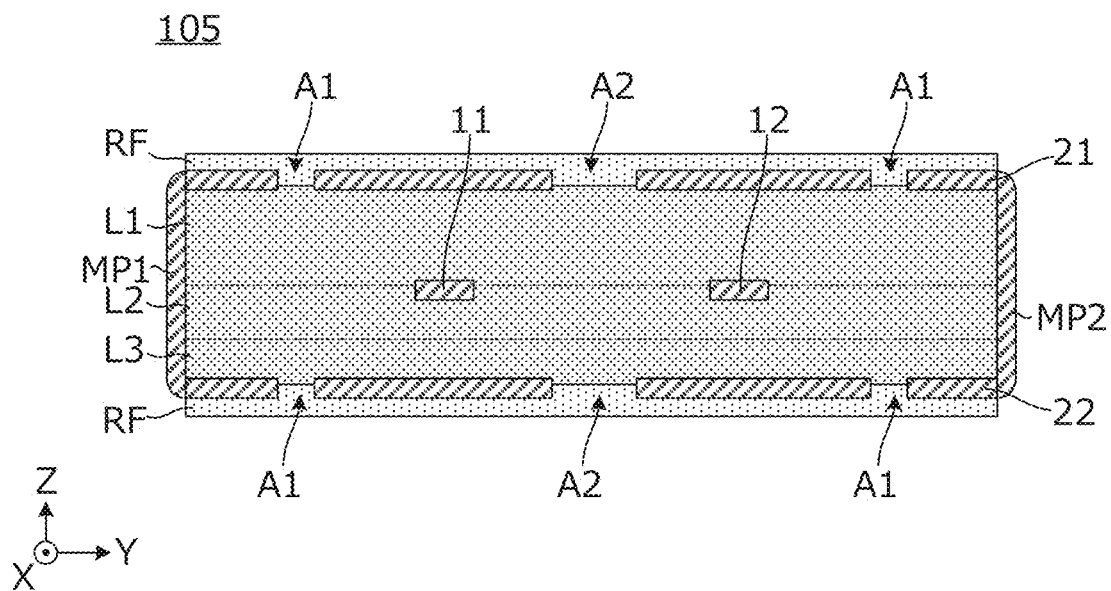
FIG. 9B is a longitudinal sectional view along the line Y2-Y2 in FIG. 8.

FIG. 9A is a longitudinal sectional view along the line Y1-Y1 in FIG. 8, and FIG. 9B is a longitudinal sectional view along the line Y2-Y2 in FIG. 8.

The resin multilayer substrate 105 has three insulating resin base material layers L1, L2, L3, resist films RF covering both surfaces of a laminate of the insulating resin base material layers L1, L2, L3, and a plurality of conductor patterns provided on the insulating resin base material layers L1, L2, L3. The conductor patterns include the signal lines 11, 12 and ground conductors 21, 22 overlapping the signal lines 11, 12 as viewed from the laminating direction of the insulating resin base material layers L1, L2, L3 (direction parallel or substantially parallel to the Z-axis). The signal lines 11, 12, the ground conductors 21, 22, and the insulating resin base material layers L1, L2, L3 between the signal lines 11, 12 and the ground conductors 21, 22 define strip-line transmission lines.

Plating films MP1, MP2 are provided on side surfaces of the laminate of the insulating resin base material layers L1, L2, L3. The plating films MP1, MP2 electrically connect the ground conductors 21, 22 to each other. The plating films MP1, MP2 are formed by, for example, a Cu electroless plating method. The other configuration is the same or substantially the same as that shown in the first preferred embodiment.

According to the fifth preferred embodiment, the plating films MP1, MP2 allow the transmission lines to have a shielding property. When the side surfaces of the laminate are thus covered with the plating films MP1, MP2, the gas is likely to be confined. However, since the openings A1, A2 are provided in the ground conductors 21, 22, the gas is easily released to the outside of the laminate.

The interlayer connecting conductor defined by the plating film is not limited to what is provided on the side surface of the laminate of the insulating resin base material layers L1, L2, L3. The interlayer connecting conductor may be provided by through-hole plating or filled-via plating for connection of the plurality of ground conductors through the laminate. Using the interlayer connecting conductor defined by through-hole plating or filled-via plating results in reduced gas generation as compared with a case of using the interlayer connecting conductor including a resin component. However, since the interlayer connecting conductor defined by through-hole plating or filled-via plating has low gas permeability, it is preferable to provide openings adjacent to or in a vicinity of the interlayer connecting conductor in plan view.

Sixth Preferred Embodiment

In a sixth preferred embodiment of the present invention, a mounting structure of an electronic component is shown.

Figure 10:
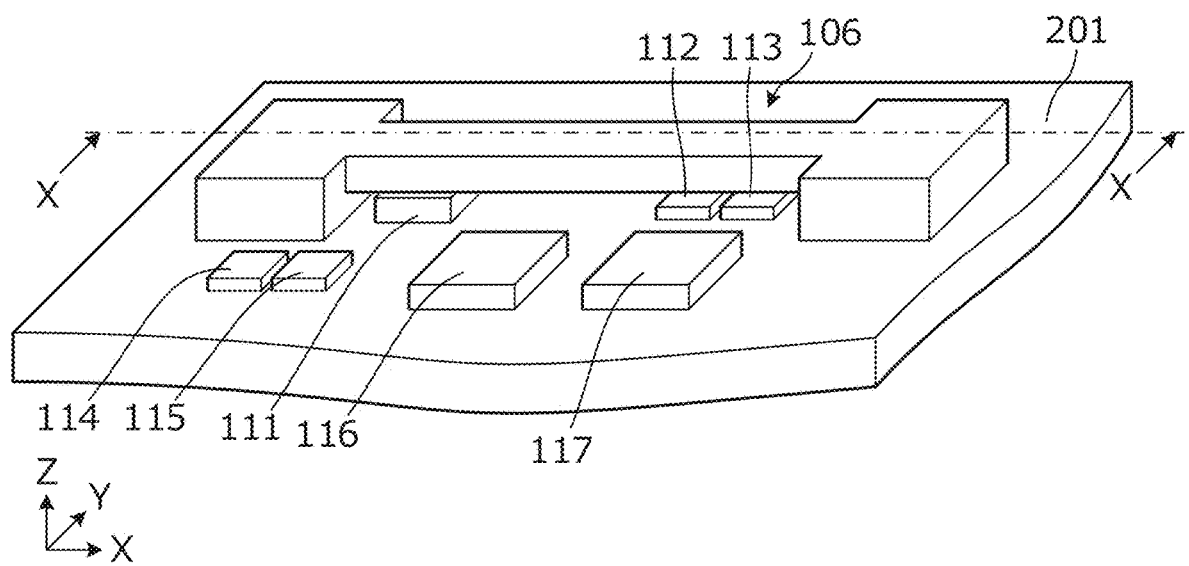
FIG. 10 is a perspective view showing a mounting structure of an electronic component according to a sixth preferred embodiment of the present invention.
Figure 11:
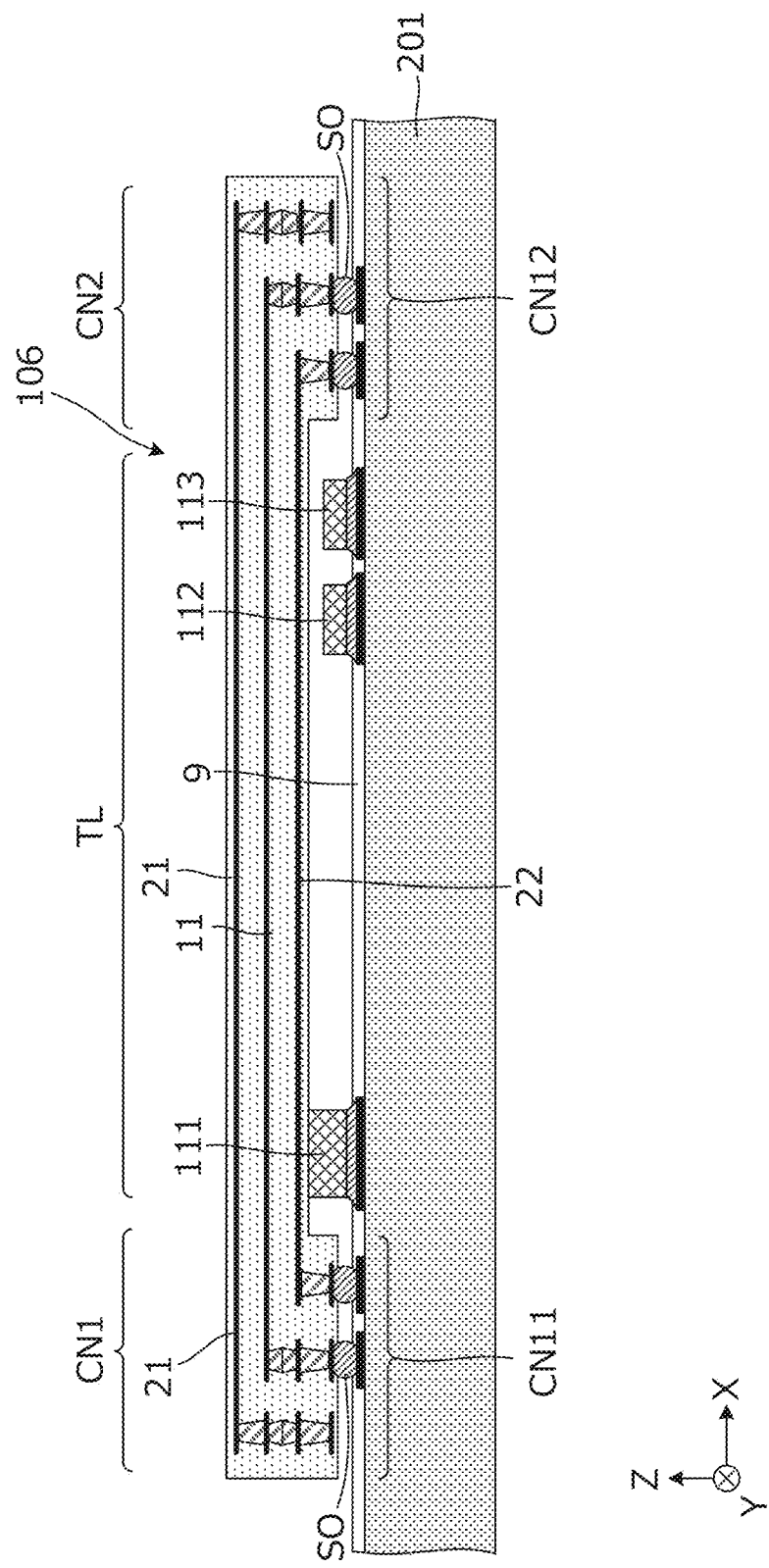
FIG. 11 is a longitudinal sectional view along the line X-X in FIG. 10.

FIG. 10 is a perspective view showing the mounting structure of the electronic component according to the sixth preferred embodiment. FIG. 11 is a longitudinal sectional view along the line X-X in FIG. 10. A resin multilayer substrate 106 of the sixth preferred embodiment is a resin multilayer substrate as an electronic component that is surface-mounted on a circuit substrate 201, the electronic component defining a flat cable.

As shown in FIGS. 10 and 11, the mounting structure of the electronic component of the sixth preferred embodiment includes the circuit substrate 201, and the resin multilayer substrate 106 and electronic components 111 to 117 that are mounted on the circuit substrate 201. The resin multilayer substrate 106 includes a laminate of a plurality of insulating resin base material layers, a transmission line portion TL, a first connecting portion CN1 linked to a first portion of the transmission line portion TL, and a second connecting portion CN2 linked to a second portion of the transmission line portion TL. The transmission line portion TL and the first and second connecting portions CN1, CN2 are provided in the laminate.

The resin multilayer substrate 106 has a longitudinal direction, which is directed to X-axis direction in FIGS. 10 and 11, and the first connecting portion CN1 and the second connecting portion CN2 are provided at both ends of the resin multilayer substrate 106 in the longitudinal direction.

As shown in FIG. 11, the circuit substrate 201 includes circuit-substrate-side connecting portions CN11, CN12 to which the first connecting portion CN1 and the second connecting portion CN2 of the resin multilayer substrate 106 are respectively connected. A resist film 9 is also provided on the circuit substrate 201.

As shown in FIG. 10, the electronic components 111, 112, 113 are located between the transmission line portion TL of the resin multilayer substrate 106 and the circuit substrate 201 in a state where the resin multilayer substrate 106 is mounted on the circuit substrate 201.

The first connecting portion CN1 of the resin multilayer substrate 106 is electrically connected to a pad electrode provided on the circuit-substrate-side first connecting portion CN11 of the circuit substrate 201 via solder SO. Similarly, the second connecting portion CN2 of the resin multilayer substrate 106 is electrically connected to a pad electrode provided on the circuit-substrate-side second connecting portion CN12 of the circuit substrate 201 via solder SO. The solder SO is preferably solder pre-coated before mounting, or a solder ball, for example.

The insulating resin base material layers of the resin multilayer substrate 106 have a lower permittivity and a lower dielectric loss than an insulator portion of the circuit substrate 201. For example, the relative permittivity of the insulator portion of the circuit substrate 201 is preferably about 4, for example, while the relative permittivity of the insulating resin base material layers of the resin multilayer substrate 106 is preferably about 3, for example.

Similar to the other electronic components 111 to 117, the resin multilayer substrate 106 is sucked by a vacuum suction head, mounted on the circuit substrate, and then surface-mounted on the circuit substrate 201 in a reflow soldering step.

Since the cross-sectional surface shown in FIG. 11 is a plane passing through a signal line, openings provided in ground conductors are not shown. However, conductor patterns provided on the respective insulating resin base material layers are the same as or similar to those shown in FIG. 2 and the like. Accordingly, the resin multilayer substrate 106 of the sixth preferred embodiment has less deformation (expansion or foam-like projection) of the outer shape or the outer surface due to delamination and ensures flatness. Therefore, even such a long resin multilayer substrate (electronic component) is able to be surface-mounted.

Other Preferred Embodiment

In each of the preferred embodiments described above, the resin multilayer substrate including the two signal lines is shown. However, the same is able to be applied to a resin multilayer substrate including three or more signal lines. In that case, openings may be provided such that, as viewed from the laminating direction of the insulating resin base material layers, the aperture ratio due to the openings provided in an inner zone that is sandwiched between two signal lines of the plurality of signal lines is higher than the aperture ratio due to the openings provided in an outer zone that is not sandwiched between the two signal lines.

In each of the preferred embodiments described above, the example is shown in which the circular openings are provided in the ground conductors. However, the shape of the openings is not limited to a circle. The shape may be a rectangle, a rounded rectangle, an oval, an ellipse, or the like. The same applies to the cross-sectional shape of the interlayer connecting conductor.

In each of the preferred embodiments described above, the example is shown in which a plurality of kinds of openings different in diameter are distributed for determining the aperture ratio. However, the aperture ratio may be determined by the distribution density of the openings. For example, even when the diameter of the openings provided in the inner zone ZI and the diameter of the openings provided in the outer zone ZO are the same or substantially the same, the aperture ratio in the inner zone ZI may be increased by narrowing the alignment pitch of the openings provided in the inner zone ZI.

In the example shown in FIGS. 1A and 1B, the electronic component used as a cable that electrically connects two members to each other is provided. However, an electronic component that is entirely mounted on a circuit substrate or a resin multilayer substrate that alone defines a predetermined circuit may include similar features.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A resin multilayer substrate comprising:
a plurality of insulating resin base material layers; and
a plurality of conductor patterns provided on the plurality of insulating resin base material layers; wherein
the plurality of conductor patterns include a plurality of signal lines provided at positions not overlapping each other as viewed from a laminating direction of the plurality of insulating resin base material layers, and a plurality of ground conductors overlapping the plurality of signal lines as viewed from the laminating direction and between which the plurality of signal lines are sandwiched in the laminating direction;
the plurality of ground conductors include a plurality of openings that provide an unevenly distributed aperture ratio;
no conductor extends from a periphery of any of the plurality of openings in the laminating direction;
as viewed from the laminating direction, the aperture ratio due to the openings provided in an inner zone that is sandwiched between two signal lines of the plurality of signal lines is higher than the aperture ratio due to the openings provided in an outer zone that is not sandwiched between the two signal lines;
the resin multilayer substrate includes an interlayer connecting conductor that electrically connects the plurality of ground conductors provided on different layers to each other; and
the aperture ratio due to the openings is higher, in a direction perpendicular or substantially perpendicular to the laminating direction, in a zone adjacent to or in a vicinity of the interlayer connecting conductor than in a zone separated from the interlayer connecting conductor.

2. The resin multilayer substrate according to claim 1, wherein the interlayer connecting conductor is provided in the outer zone.

3. The resin multilayer substrate according to claim 1, wherein the interlayer connecting conductor is provided in the inner zone.

4. The resin multilayer substrate according to claim 1, wherein the interlayer connecting conductor includes a resin component.

5. The resin multilayer substrate according to claim 4, wherein the interlayer connecting conductor is in contact with the plurality of insulating resin base material layers via the openings.

6. The resin multilayer substrate according to claim 5, wherein both sides of the interlayer connecting conductor in the laminating direction are in contact with the plurality of insulating resin base material layers via the openings.

7. The resin multilayer substrate according to claim 5, wherein the interlayer connecting conductor is provided over the plurality of insulating resin base material layers and includes a portion provided in a zigzag shape in the laminating direction.

8. The resin multilayer substrate according to claim 1, wherein the openings are provided only at positions not overlapping the plurality of signal lines as viewed from the laminating direction.

9. The resin multilayer substrate according to claim 1, wherein a portion of the interlayer connecting conductor is provided by providing a conductive paste in at least one via opening of at least one of the plurality of insulating resin base material layers.

10. The resin multilayer substrate according to claim 1, wherein a portion of the interlayer connecting conductor is provided by patterning Cu foil on at least one of the plurality of insulating resin base material layers.

11. The resin multilayer substrate according to claim 1, wherein the openings in the inner zone have larger diameters than diameters of the openings in the outer zone.

12. The resin multilayer substrate according to claim 1, wherein
the openings in the inner zone are disposed a first distance from one another in a direction perpendicular or substantially perpendicular to the lamination direction; and
the openings in the outer zone are disposed a second distance from one another in the direction perpendicular or substantially perpendicular to the lamination direction.

13. The resin multilayer substrate according to claim 12, wherein the first distance is different from the second distance.

14. The resin multilayer substrate according to claim 1, wherein at least a portion of the openings are provided at positions that do not overlap the signal lines as viewed from the laminating direction.

15. The resin multilayer substrate according to claim 1, wherein
the openings in the inner zone have diameters of about 50 µm to about 90 µm; and
the openings in the outer zone have diameters of about 30 µm to about 70 µm.

16. An electronic component comprising:
a first connecting portion and a second connecting portion to be electrically connected to an external circuit; and
a transmission line portion linking the first connecting portion and the second connecting portion; wherein
the first connecting portion, the second connecting portion, and the transmission line portion are defined by a resin multilayer substrate, the resin multilayer substrate including:
a plurality of insulating resin base material layers; and
a plurality of conductor patterns provided on the plurality of insulating resin base material layers;
the plurality of conductor patterns include a plurality of signal lines provided at positions not overlapping each other as viewed from a laminating direction of the plurality of insulating resin base material layers, and a plurality of ground conductors overlapping the plurality of signal lines as viewed from the laminating direction and between which the plurality of signal lines are sandwiched in the laminating direction;
the plurality of ground conductors includes a plurality of openings that provide an unevenly distributed aperture ratio;
no conductor extends from a periphery of any of the plurality of openings in the laminating direction;
as viewed from the laminating direction, the aperture ratio due to the openings provided in an inner zone that is sandwiched between two signal lines of the plurality of signal lines is higher than the aperture ratio due to the openings provided in an outer zone that is not sandwiched between the two signal lines;
the resin multilayer substrate includes an interlayer connecting conductor that electrically connects the plurality of ground conductors provided on different layers to each other; and
the aperture ratio due to the openings is higher, in a direction perpendicular or substantially perpendicular to the laminating direction, in a zone adjacent to or in a vicinity of the interlayer connecting conductor than in a zone separated from the interlayer connecting conductor.

17. A mounting structure of an electronic component, comprising:
a circuit substrate; and
an electronic component that is surface-mounted on the circuit substrate, the electronic component including:
a first connecting portion and a second connecting portion to be electrically connected to an external circuit; and
a transmission line portion linking the first connecting portion and the second connecting portion; wherein
the first connecting portion, the second connecting portion, and the transmission line portion are defined by a resin multilayer substrate, the resin multilayer substrate including:
a plurality of insulating resin base material layers; and
a plurality of conductor patterns provided on the plurality of insulating resin base material layers;
the plurality of conductor patterns include a plurality of signal lines provided at positions not overlapping each other as viewed from a laminating direction of the plurality of insulating resin base material layers, and a plurality of ground conductors overlapping the plurality of signal lines as viewed from the laminating direction and between which the plurality of signal lines are sandwiched in the laminating direction;
the plurality of ground conductors includes a plurality of openings that provide an unevenly distributed aperture ratio;
no conductor extends from a periphery of any of the plurality of openings in the laminating direction;
as viewed from the laminating direction, the aperture ratio due to the openings provided in an inner zone that is sandwiched between two signal lines of the plurality of signal lines is higher than the aperture ratio due to the openings provided in an outer zone that is not sandwiched between the two signal lines;
the resin multilayer substrate includes an interlayer connecting conductor that electrically connects the plurality of ground conductors provided on different layers to each other; and
the aperture ratio due to the openings is higher, in a direction perpendicular or substantially perpendicular to the laminating direction, in a zone adjacent to or in a vicinity of the interlayer connecting conductor than in a zone separated from the interlayer connecting conductor.

* * * * *